United States Patent [19]

Wakahara

[11] Patent Number: 5,702,562
[45] Date of Patent: Dec. 30, 1997

[54] DRY ETCHING APPARATUS AND METHOD

[75] Inventor: Ken Wakahara, Tokyo, Japan

[73] Assignee: NEC Corporation, Tokyo, Japan

[21] Appl. No.: 639,775

[22] Filed: Apr. 29, 1996

[30] Foreign Application Priority Data

Apr. 27, 1995 [JP] Japan .................. 7-103752

[51] Int. Cl.[6] .............................. H01L 21/00
[52] U.S. Cl. ............. 156/626.1; 156/345; 216/60; 216/67
[58] Field of Search .............. 156/626.1, 643.1, 156/345; 216/67, 59, 60; 204/192.33, 298.32

[56] References Cited

U.S. PATENT DOCUMENTS

| | | | |
|---|---|---|---|
| 4,767,496 | 8/1988 | Hieber | 156/626.1 |
| 5,374,327 | 12/1994 | Imahashi et al. | 156/626.1 |
| 5,642,296 | 6/1997 | Saxena | 156/626.1 X |

FOREIGN PATENT DOCUMENTS

| | | |
|---|---|---|
| 61-104624 | 5/1986 | Japan . |
| 4-355918 | 12/1992 | Japan . |
| 5-114586 | 5/1993 | Japan . |

Primary Examiner—William Powell
Attorney, Agent, or Firm—Sughrue, Mion, Zinn, Macpeak & Seas, PLLC

[57] ABSTRACT

Disclosed is a dry etching apparatus for etching an etched material located in an etching chamber by an etching gas plasma, which has: a plurality of emission detectors for detecting intensities of different wavelength components which are generated in etching reaction; an emission analyzer for analyzing an intensity ratio therebetween from the detected intensities; a process data computing circuit for computing a selectivity ratio and etching rate to different films from an output signal of the emission analyzer; and an etching parameter operational controller for feedback-controlling RF power, degree of vacuum and gas flow rate or gas flow rate ratio on the basis of an output signal of the process data computing circuit.

5 Claims, 3 Drawing Sheets

DRY ETCHING APPARATUS AND METHOD

FIELD OF THE INVENTION

This invention relates to a dry etching apparatus and method, and more particularly to, a dry etching apparatus and method for etching an integrated circuit pattern selectively exposed on a semiconductor wafer by a gas plasma.

BACKGROUND OF THE INVENTION

A conventional dry etching apparatus comprises an etching chamber in which an upper electrode and lower electrode for generating electric field by a high-frequency voltage applied to the upper electrode are provided, a gas flow controller for supplying a reaction gas at a predetermined flow rate into the etching chamber, an emission detector for detecting an emission from the etched film in the etching chamber, a RF output controller for applying the high-frequency voltage to the upper electrode, a pressure controller for controlling the amount of the opening of a butterfly valve to provide a desired degree of vacuum with the etching chamber, a vacuum pump for evacuating the gas inside the etching chamber and an etching end decision instructor for deciding an etching end point and outputting a stop command to the RF output controller, pressure controller and gas flow controller to terminate the etching reaction.

However, in the above dry etching apparatus, the precise decision of the etching end point cannot be obtained when the emission intensity from the etched film is low and the emission intensity from the base film is high. On the other hand, when the dispersion of thickness in the etched film or the abnormal etching reaction caused by a variation of plasma state in the etching chamber is occurred, the above dry etching apparatus cannot control to correct them.

To improve the precision of emission detection, the Japanese patent application laid-open No. 5-114586 discloses a detector for dry etching which detects an end point by monitoring light with a plurality of different wavelengths. However, it does not teach a means for controlling to correct the abnormal etching reaction such as side-etching.

On the other hand, to remove or decrease a residual gas after the reaction, Japanese patent application laid-open No. 61-104624 discloses a dry etching method in which a process gas is introduced to absorb the residual etchant after the decision of etching end point is made. However, it teaches a correction control only after the decision of etching point. Namely, the control during the etching process is not considered therein. In addition, the control employed is limited to the introduction of process gas.

Furthermore, to facilitate the decision of end point, Japanese patent application laid-open No. 4-355918 discloses a dry etching method in which optimum process gases on the early step of etching (to promote the etching) and near the end point of etching (to control the etching speed) are used. However, the control employed is limited to the selective introduction and the flow rate of etching gas.

As mentioned above, the conventional dry etching apparatus or method does not take into account the process parameter control such as RF power and degree of vacuum which is important to control the dispersion of thickness in the etched film or the abnormal etching reaction caused by a variation of plasma state in the etching chamber. Recently, it is highly desired to finely control the shape, selectivity ratio etc. as to the etched film during the dry etching process since the etched film with a miniaturized pattern and a multilayered structure is rapidly developed.

SUMMARY OF THE INVENTION

Accordingly, it is an object of the invention to provide a dry etching apparatus and method in which the shape, selectivity ratio etc. as to the etched film can be finely controlled during the dry etching process.

According to the invention, a dry etching apparatus for etching an etched material located in an etching chamber by an etching gas plasma, comprises:

a plurality of emission detectors for detecting intensities of different wavelength components which are generated in etching reaction;

an emission analyzer for analyzing an intensity ratio therebetween from the detected intensities;

a process data computing circuit for computing a selectivity ratio and etching rate to different films from an output signal of the emission analyzer; and an etching parameter operational controller for feedback-controlling RF power, degree of vacuum and gas flow rate or gas flow rate ratio on the basis of an output signal of the process data computing circuit.

According to another aspect of the invention, a dry etching method for etching an etched material, comprises the steps of:

monitoring simultaneously plasma emission wavelengths and emission intensities which are proper to an etched film, photoresist and etching gas, respectively by a plurality of emission detectors;

calculating an etching rate and a selectivity ratio of the etched film and base film from the intensity ratio therebetween;

deciding a degree of etching reaction on the basis of the etching rate and selectivity ratio calculated; and correcting a process parameter comprising RF power, degree of vacuum, etching gas flow rate and etching gas flow rate ratio to control the process parameter depending on the decision to the degree of etching reaction.

In accordance with the invention, the emission intensities of the etched film, base film and etching gas etc. can be simultaneously monitored and the etching rate and selectivity ratio can be calculated from the data of the emission intensities and the intensity ratios therebetween. Based on the calculated data, the degree of reaction can be decided. Thereby real-time correction of the etching control parameters such as RF power, degree of vacuum, gas flow rate etc can be conducted. In addition, the correction control can be effective in all the etching process from the beginning of etching to the decision of etching end point including over-etch-step. Therefore, the shape obtained by the etching process can be finely controlled.

Furthermore, the invention can be sufficiently applied to a further miniaturized LSI which requires a more finely etching control.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a dry etching apparatus in the preferred embodiment, the aforementioned conventional dry etching apparatus will be explained in FIG. 1.

Figure 1:
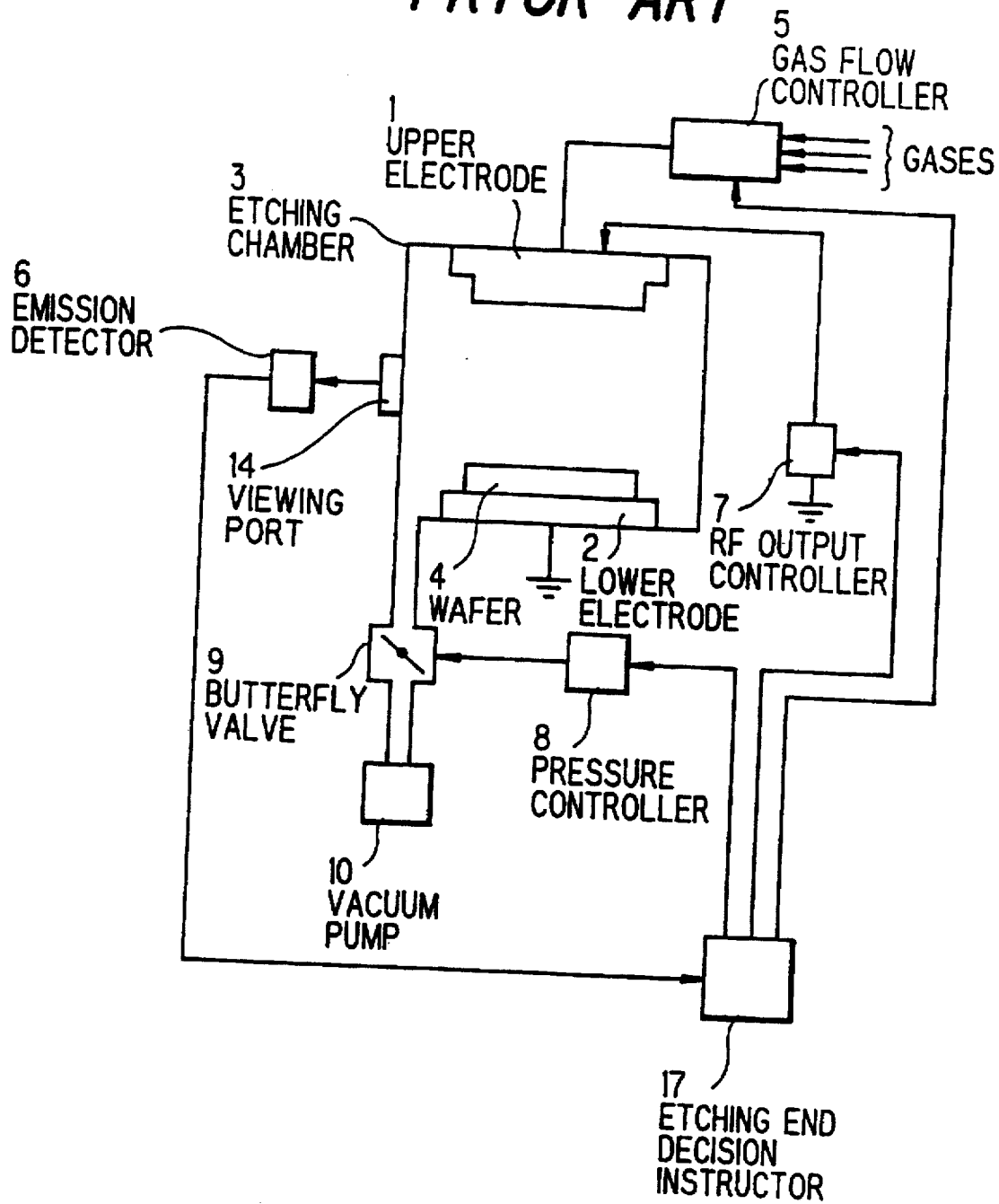
FIG. 1 is an explanatory diagram showing a conventional dry etching apparatus.

As shown in FIG. 1, the conventional dry etching apparatus comprises an etching chamber 3 in which an upper electrode 1 and lower electrode 2 are provided, a gas flow controller 5 for supplying a reaction gas at a predetermined flow rate into the etching chamber 3, an emission detector 6 for detecting an emission from the etched film in a wafer 4, a RF output controller 7 for applying a high-frequency voltage to the upper electrode 1, a pressure controller 8 for controlling the amount of the opening of a butterfly valve 9 to provide a desired degree of vacuum with the etching chamber 3, a vacuum pump 10 for evacuating the gas inside the etching chamber 3 and an etching end decision instructor 17 for deciding an etching end point and outputting a stop command to the RF output controller 7, pressure controller 8 and gas flow controller 5.

In operation, the inside of the etching chamber 3 is previously evacuated by a vacuum pump 10 and is kept at a predetermined degree of vacuum by a butterfly valve 9. When the etching process is started, process gases are supplied through the upper electrode 1 into the etching chamber 3. The lower electrode 2 on which the wafer 4 is laid is grounded. By the electric field generated between the lower electrode 2 on which the wafer 4 is laid and the upper electrode 1, plasma gas is generated to start the etching reaction. When the etching reaction is started, the emission detector 6 monitors light with a single wavelength through a viewing port 14 to output an emission signal corresponding to the light intensity. When the intensity of the emission signal output from the emission detector 6 reaches a threshold value previously set, the etching end decision instructor 17 makes a decision that the reaction reaches the end point. Then, the etching end decision instructor 17 outputs a stop command to the RF output controller 7, pressure controller 8 and gas flow controller 5. On that time, the etching process is terminated.

Figure 2:
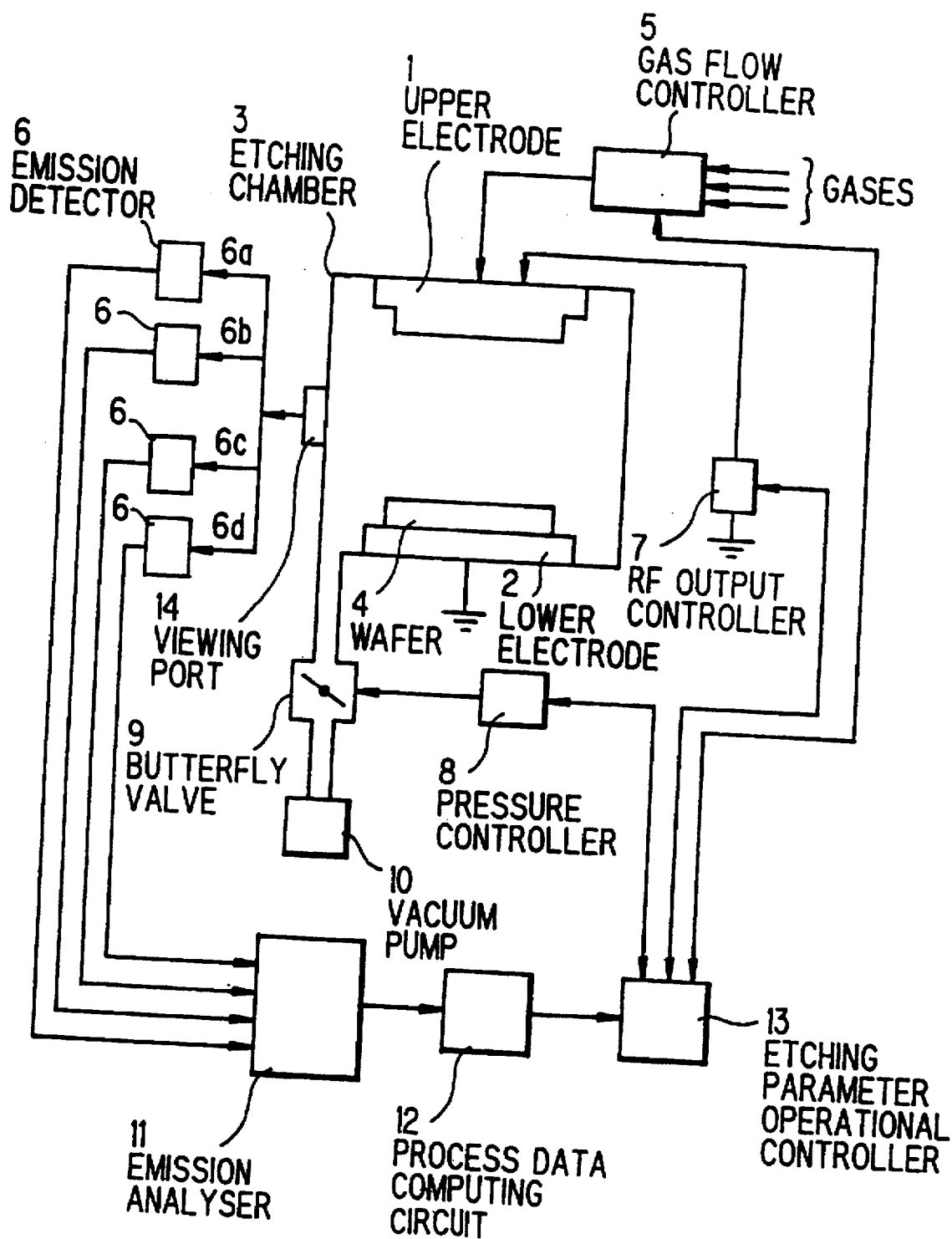
FIG. 2 is an explanatory diagram showing a dry etching apparatus in a first preferred embodiment according to the invention.

Next, a dry etching apparatus in the first preferred embodiment will be explained in FIG. 2, wherein like parts are indicated by like reference numerals as used in FIG. 1.

In the first preferred embodiment, the dry etching apparatus comprises a plurality of emission detectors 6a, 6b, 6c and 6d (four detectors in this example) for detecting different wavelength components, an emission analyzer 11 for analyzing the intensity ratio therebetween, a process data computing circuit 12 for computing selectivity factors, etching rates etc. of various different films according to the output signal from the emission analyzer 11, an etching parameter operational controller 13 for feedbacking to control a RF output controller 7, a pressure controller 8 and a gas flow controller 5 by the output signal from the process data computing circuit 12.

In an etching chamber 3, a pair of electrodes electrically insulated an insulating member, i.e., an upper electrode 1 and a lower electrode 2 as a support member for laying a wafer 4 thereon, are provided opposite to each other. The lower electrode 2 is grounded, and a high-frequency voltage is applied to the upper electrode 1 through the RF output controller 7. The inside of the etching chamber 3 is previously evacuated by a vacuum pump 10 and is kept at a predetermined degree of vacuum by a butterfly valve 9. The gas flow controller 5 serves as a introduction system for supplying a reaction gas at a predetermined flow rate into the etching chamber 3 through the upper electrode 1. The gas supplied through the upper electrode 1 into the etching chamber 3 is excited by the high-frequency electric field applied to the upper electrode 1 through the RF output controller 7 to be in the state of plasma. An etched film formed on the wafer 4 is subject to the plasma etching by the electron and radical of plasma. Thereafter, the residual gas and products occurred in the etching reaction are exhausted through the butterfly valve 9 by the vacuum pump 10.

An example will be shown below in which a two-layer film structure that the etched film is aluminum and base film is TiN of barrier metal is applied to the dry etching apparatus in the first embodiment of the invention.

When the etching reaction is started, the emission detectors 6a, 6b, 6c and 6d monitors through a viewing port 14 a plurality of lights with wavelengths of, for example, 308 nm, 396 nm, 483 nm (C—O) and 741 nm proper to aluminum (etched film), TiN (base film), photoresist and etching gas ($Cl_2$), respectively. Each emission output is input to the emission analyzer 11 to obtain each intensity ratio and timing. The output signal therefrom is input to the process data computing circuit 12 to be collated with an emission wavelength proper to etch substance which is previously input thereto, thereby obtaining data of etching rate of the etched film etc. Then, from the ratio between the etching rate data of different film elements, the selectivity ratios of aluminum to TiN, aluminum to photoresist are calculated. The data of the calculated etching rate and selectivity ratio are input to the etching parameter operational controller 13.

The etching parameter operational controller 13 makes decision to these input signals to feedback to control the RF output controller 7, pressure controller 8 and gas flow controller 5, for example, to promote the etching of the film or film element delayed in the proceeding of the etching reaction, where the real-time correction control is carried out according to the degree of proceeding of the etching. After deciding the etching end, the correction control is continuously conducted in an over-etching step with a recipe previously set. Then, all the etching process is terminated.

As explained above, the dry etching apparatus according to the invention can automatically control the process parameter during the etching process according to the change of the condition regarding the apparatus, such as the dispersion of the thickness and quality of the etched film due to a variation in process etc., pollution inside the etching chamber, variation of plasma state or the like. However, the automatic control may cause the managerial inconvenience that the variation in preliminary step such as change of CVD film quality is delayed to be feedbacked to the production line. In addition, though the process parameters of the dry etching apparatus such as a RF power, degree of vacuum and gas flow rate to be controlled by a mass flow controller can be regulated to be collated with values under the national standard on mass production level in the frequency of once a year, a variation such as zero-point shifting, dislocation of linearity maybe occurred. Thus, in the second preferred embodiment explained later, a range of limitation is added to the automatic control to serve as an internal lock to be activated when monitoring the variation in preliminary step, the change of the apparatus condition.

Figure 3:
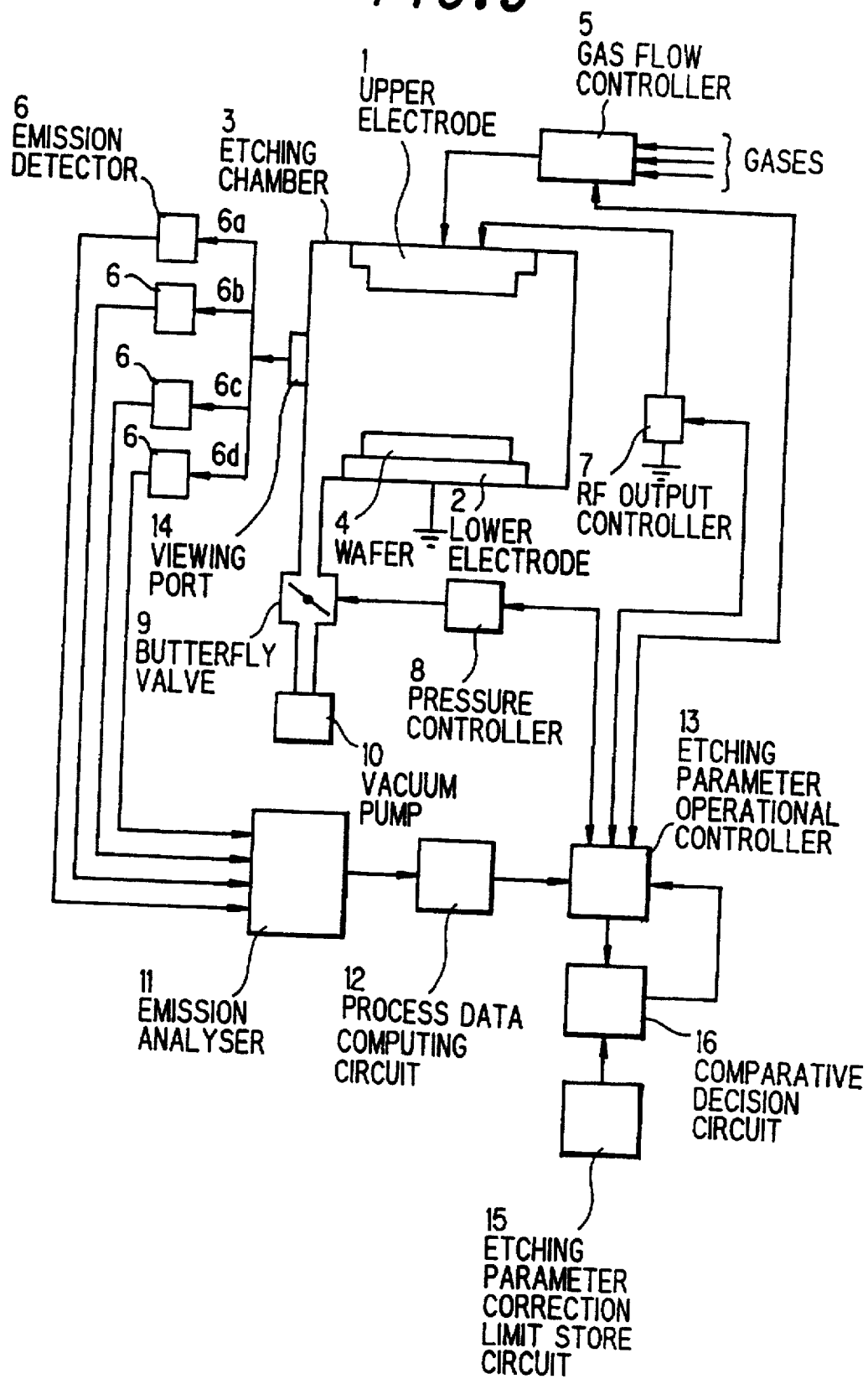
FIG. 3 is an explanatory diagram showing a dry etching apparatus in a second preferred embodiment according to the invention.

A dry etching apparatus in the second preferred embodiment will be explained in FIG. 3, wherein like parts are indicated by like reference numerals as used in FIG. 2.

In the second preferred embodiment, to satisfy the above requirement, the dry etching apparatus further comprises an etching parameter correction limit store circuit 15 for previously storing a correction limit value to RF power, degree of vacuum, gas flow rate and gas flow rate ratio, and a comparative decision circuit 16 for comparing a correction value output from the etching parameter operational controller 13 with the correction limit value stored in the comparative decision circuit 15.

For example, when etching an oxide film on a step for fabricating a contact for a standard 4M DRAM, RF power, degree of vacuum and gas flow rate are set about 850 W, 850 mTorr and $CF_4/CHF_3/Ar=20/20/400$ sccm, respectively. The etching rate of the oxide film highly depends on RF power characteristics, therefore varying at a level of 10 Å/1W in the vicinity of 850 W. However, taking the selectivity ratio to photoresist into account, the level of the correction value of RF power needs to be less than 100 W.

Here, a correction upper limit value of 100 W for RF power is previously set in the etching parameter correction limit store circuit 15. For example, when the quality of the oxide film formed by CVD is out of order and the etching rate is quite low such that a sufficient emission cannot be obtained within a period for deciding the etching end, the etching parameter operational controller 13 controls to increase the RF power. If a correction value of the RF power over 100 W is output, the comparative decision circuit 16 compares the correction value and the RF power correction limit value stored in the etching parameter correction limit store circuit 15 and then makes decision to cancel the correction value as well as dealing with it as the correction upper limit error and/or alarming the production line.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A dry etching apparatus for etching an etched material located in an etching chamber by an etching gas plasma, comprising:

a plurality of emission detectors for detecting intensities of different wavelength components which are generated in etching reaction;

an emission analyzer for analyzing an intensity ratio therebetween from said detected intensities;

a process data computing circuit for computing a selectivity ratio and etching rate to different films from an output signal of said emission analyzer; and an etching parameter operational controller for feedback-controlling RF power, degree of vacuum and gas flow rate or gas flow rate ratio on the basis of an output signal of said process data computing circuit.

2. A dry etching apparatus, according to claim 1, further comprising:

an etching parameter correction limit store circuit in which a correction limit value for RF power, degree of vacuum, gas flow rate and gas flow rate ratio is previously stored; and a comparative decision circuit for comparing a correction value output from said etching parameter operational controller with said correction limit value output from said etching parameter correction limit store circuit.

3. A dry etching apparatus, according to claim 2, wherein:

said comparative decision circuit makes decision to cancel said correction value and/or alarm a production line when said correction value is greater than said correction limit value.

4. A dry etching method for etching an etched material, comprising the steps of:

monitoring simultaneously plasma emission wavelengths and emission intensities which are proper to an etched film, photoresist and etching gas, respectively by a plurality of emission detectors;

calculating an etching rate and a selectivity ratio of said etched film and base film from said intensity ratio therebetween;

deciding a degree of etching reaction on the basis of said etching rate and selectivity ratio calculated; and correcting a process parameter comprising RF power, degree of vacuum, etching gas flow rate and etching gas flow rate ratio to control said process parameter depending on said decision to said degree of etching reaction.

5. A dry etching method, according to claim 4, wherein:

said correcting step is conducted such that said correcting of said process parameter falls within a preset correction limit value.

* * * * *